United States Patent
Yoshihara et al.

(10) Patent No.: US 7,601,933 B2
(45) Date of Patent: Oct. 13, 2009

(54) HEAT PROCESSING APPARATUS AND HEAT PROCESSING METHOD

(75) Inventors: Kousuke Yoshihara, Kikuchi-gun (JP); Yuichi Terashita, Kikuchi-gun (JP); Momoko Shizukuishi, Tokyo (JP); Atsushi Ookouchi, Kikuchi-gun (JP); Hideharu Kyouda, Kukuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 574 days.

(21) Appl. No.: 10/550,284

(22) PCT Filed: Mar. 26, 2004

(86) PCT No.: PCT/JP2004/004359

§ 371 (c)(1),
(2), (4) Date: Sep. 22, 2005

(87) PCT Pub. No.: WO2004/090951

PCT Pub. Date: Oct. 21, 2004

(65) Prior Publication Data

US 2006/0193986 A1   Aug. 31, 2006

(30) Foreign Application Priority Data

Apr. 1, 2003   (JP)   ............................. 2003-097840

(51) Int. Cl.
*H05B 3/68* (2006.01)
*F26B 19/00* (2006.01)
*C23C 16/00* (2006.01)

(52) U.S. Cl. ..................... 219/444.1; 392/416; 118/724

(58) Field of Classification Search . 219/444.1–448.12, 219/390; 392/416–418; 118/724, 725; 432/247, 432/253, 258
See application file for complete search history.

(56) References Cited

U.S. PATENT DOCUMENTS

| 6,097,005 | A  | * | 8/2000 | Akimoto | .................. | 219/444.1 |
| 6,222,161 | B1 | * | 4/2001 | Shirakawa et al. | .......... | 219/390 |
| 6,246,030 | B1 | * | 6/2001 | Matsuyama | .................. | 219/390 |
| 2002/0086259 | A1 | * | 7/2002 | Shirakawa et al. | .......... | 432/152 |
| 2002/0123011 | A1 | * | 9/2002 | Kawano et al. | ............. | 430/330 |

FOREIGN PATENT DOCUMENTS

JP   61-89632   5/1986
JP   6-84782    3/1994

(Continued)

*Primary Examiner*—Sang Y Paik
(74) *Attorney, Agent, or Firm*—Oblon, Spivak, McClelland, Maier & Neustadt, L.L.P.

(57) ABSTRACT

A heat processing device that bakes a substrate having a resist coating film containing a volatile substance, includes a hot plate 2, a hot plate temperature control unit 3, a box member 1a, 5, 32 that defines a heat space 30 and a fluid space 31, air supply unit 18, 18A and suction unit 10, 10A that create an air current flowing in a horizontal direction in the fluid space 31, and a controller 22, 22A that controls the hot plate temperature control unit 3, the air supply unit 18, 18A, suction unit 10, 10A and the gas temperature control unit 19 so that a relationship of $TF<TH \leq TS \leq TP$ is satisfied where TP represents a temperature of the hot plate, TS represents an upper surface temperature of the substrate W, TH represents a temperature of the heat space and TF represents a temperature of the fluid space.

15 Claims, 8 Drawing Sheets

FOREIGN PATENT DOCUMENTS

| | | |
|---|---|---|
| JP | 11-204391 | 7/1999 |
| JP | 11-204417 | 7/1999 |
| JP | 2002-8967 | 1/2002 |
| JP | 2002-228375 | 8/2002 |
| JP | 2002-289513 | 10/2002 |
| JP | 2002-359175 | 12/2002 |

* cited by examiner

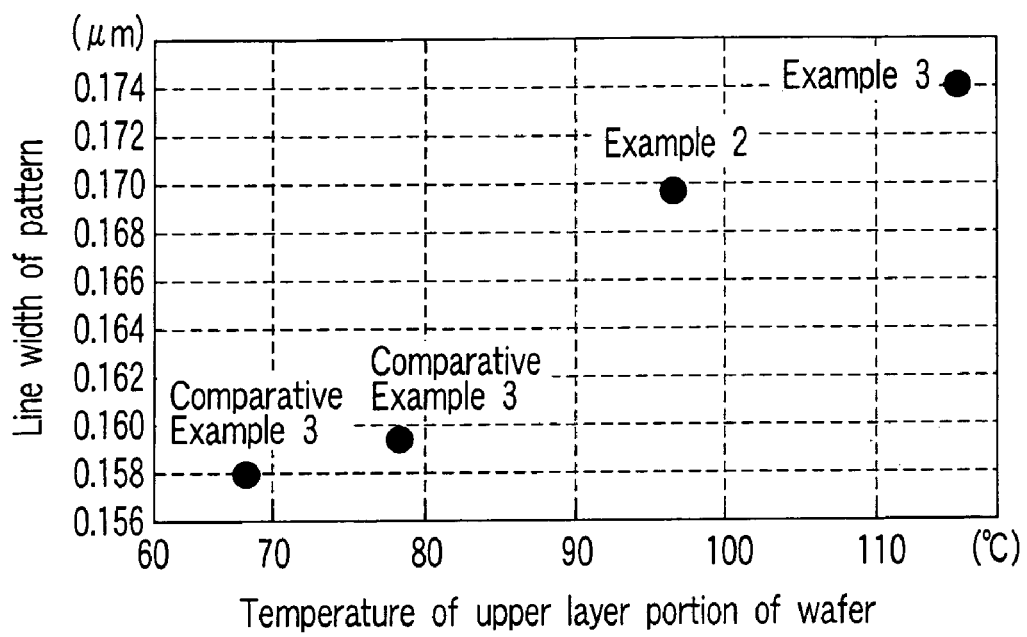
F I G. 11
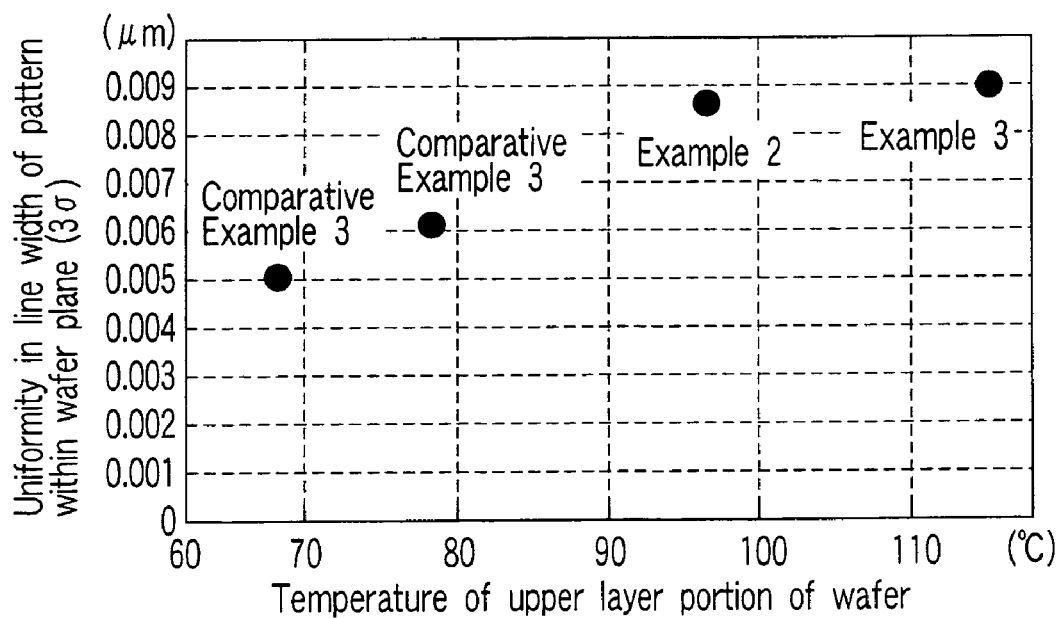
F I G. 12

HEAT PROCESSING APPARATUS AND HEAT PROCESSING METHOD

TECHNICAL FIELD

The present invention relates to a heat processing apparatus and a heat processing method, in which a resist film is subjected to post exposure baking (PEB) after exposure and before development.

BACKGROUND ART

In the photolithography process for semiconductor devices or liquid crystal displays, a to-be-processed substrate is coated with a chemically amplified resist, and the resist coating film is pre-baked and exposed with a pattern, which is further subjected to post exposure baking (to be called "PEB" hereinafter), and then development. The chemical sensitization type resist is highly dependent on the environment, and if there is even a very fine amount of organic amine (for example, ammonium or N-methyl•2pyrrolidinone) or its polar molecule (these to be called "alkali component" hereinafter), a neutralization reaction occurs between the resist and the alkali component, thereby easily causing the inactivation of the resist. If the resist is inactivated, the resolution in the developing step is lowered and therefore a pattern of a desired line width cannot be obtained, causing the so-called development error. In order to avoid this, the atmosphere within the processing system, especially, the atmosphere within the PEB unit serving as a heat processing apparatus is strictly controlled so that no alkali component is present therein.

For the pattern exposure of the chemically amplified resist, a KrF excimer laser (wavelength of 248 mm) or an ArF excimer laser (wavelength of 193 nm) is employed. In the case where the KrF excimer laser is used to expose the resist film, the PEB reaction proceeds at a sensitivity of about 3 to 4 nm/° C. On the other hand, in the case where the ArF excimer laser is used to expose the resist film, the PEB reaction proceeds at a sensitivity of about 10 nm/° C. Thus, the PEB reaction is highly temperature-dependent, the heating temperature of the silicon wafer needs to be strictly managed by controlling the feeding of electricity to the hot plate with a high accuracy.

Incidentally, in the case where a currently employed recipe is changed to another recipe, the usual procedure is that the PEB process to the silicon wafer, which is currently carried out, is finished temporarily and then the temperature within the PEB unit is increased to a new set value in accordance with the new recipe. During this period, due to the radiant heat from the hot plate, the internal space of the PEB unit is gradually heated up, and at the same time, the temperature of the top cover is gradually increased. Here, if the PEB process is re-started while the temperature of the cover is being varied, several of the silicon wafers processed in the initial stage receive the radiant heat from the cover, thereby causing variation in the line width of pattern in some cases.

Jpn. Pat. Appln. KOKAI Publication No. 2002-228375 (to be referred to as Patent Document 1) discloses a PEB unit in which a heat pipe 201 is mounted in an upper section 200a of a cover 200 as shown in FIG. 1. The cover 200 has a substantially cylindrical shape and is made of aluminum or stainless steel, and includes a suction port 202 at its center. The heat pipe 201 has excellent heat conductivity and heat responsiveness, and therefore the temperature of the cover 200 quickly responds to the variation in temperature of the peripheral members, for example, the temperature variation of the hot plate. The temperature of the cover 200 is quickly stabilized by the heat pipe 201.

It should be noted that in the case of the apparatus disclosed in Patent Document 1, no matter how strictly the heating operation of the hot plate is managed, heat is radiated from the hot plate at all times, and therefore the heat is confined within the PEB unit (which is substantially an air-tight space) to create a section that is regionally over-heated. As a result, a turbulent flow is generated within the PEB unit, and the turbulent flow of hot air influences the resist coating film thermally, thereby possibly varying the line width of the pattern.

In the meantime, in some cases, the acid inhibitor (a volatile basic substance called "quencher") contained in the chemically amplified resist is volatilized and sublimated to precipitate and attach to the periphery portion of the suction opening 202, which may be blown away by the turbulent flow to create particles of the basic material. If some of the particles of the basic substance fall onto the silicon wafer, a defect is created in the pattern circuit.

It should be noted here that in the apparatus disclosed in Patent Document 1, the temperature of the cover 200 is made to quickly respond to the radiant heat from the hot plate to stabilize the temperature within the apparatus quickly. However, this document does not at all consider the management of temperature during the PEB process. Even if the apparatus of Patent Document 1 is used during a PEB process and the temperature of the cover 200 is made to quickly follow the temperature of the hot plate to maintain the internal of the apparatus at a constant temperature, heat is radiated from the hot plate at all times, thereby confining the heat within the PEB unit (accumulation of heat) as in the above-described case and possibly creating a turbulent flow.

DISCLOSURE OF INVENTION

The object of the present invention is to provide a heat processing apparatus that can enhance the resolution of a latent image pattern formed on a chemically amplified resist film without creating a defect in the pattern circuit, and such a heat processing method.

The inventors of the present invention have completed the present invention based on a novel technical idea that is different from the conventional ones, in which the temperature within the PEB unit is made further uniform. More specifically, the inventors carried out intensive studies and research on the heat flow within a PEB unit, and have found that when the temperature within a PEB unit is controlled in such a manner that the temperature is gradually decreased from the lower section of the PEB unit towards the upper section thereof, the confinement of heat within the PEB unit does not occur easily, and therefore a turbulent flow is not easily created. Consequently, the line width of a pattern can be accurately controlled.

According to an aspect of the present invention, there is provided a heat processing device that bakes a substrate having a resist coating film containing a volatile substance, the device characterized by comprising: a hot plate that heats the substrate; a hot plate temperature control unit that control a temperature of the hot plate; a box member having wall surfaces that defines a heat space around the hot plate and defines a fluid space above the heat space, the heat space and the fluid space being communicated to each other and the wall surface that defines the heat space having no opening; and air current producing means including an air supply port and a suction port opened in the wall surfaces that define the fluid space, that supplies a gas from the air supply port to the fluid space and exhausts the supplied gas from the fluid space via the suction port by suction, to create a current of air flowing in substantially a horizontal direction in the fluid space.

It is alternatively possible that the heat processing device of the present invention further comprises: control means for controlling the hot plate temperature control unit and the air current producing means so that a relationship of TF<TH≦TS≦TP is satisfied where TP represents a temperature of the hot plate, TS represents an upper surface temperature of the substrate W, TH represents a temperature of the heat space and TF represents a temperature of the fluid space.

It is alternatively possible that the heat processing device of the present invention further comprises: a first temperature sensor that detects the temperature TP of the hot plate, a second temperature sensor that detects the upper surface temperature TS of the substrate, a third temperature sensor that detects the temperature TH of the heat space and a fourth temperature sensor that detects the temperature TF of the fluid space. These temperature sensors serve not only to simply monitor a change in temperature inside the device, but also based on the detected data of the temperatures TP, TS, TH and TF obtained, the control means can control the operation of each member so that a relationship of TF<TH≦TS≦TP is satisfied.

It is alternatively possible that the heat processing device of the present invention further comprises: a filter provided in the box member to partition the heat space and the fluid space from each other, that traps the volatile substance. Further, it is alternatively possible that the heat processing device of the present invention further comprises: filter ascending/descending means controlled by the control means, for changing a distance between the filter and the substrate. Furthermore, it is alternatively possible that the heat processing device of the present invention further comprises: means for detecting a temperature of the filter, and the control means adjust the distance between the filter and the substrate with reference to the detected temperature of the filter or a change in temperature of the filter. It should be noted that the filter has another function of the so-called rectifying effect as well, to prevent a turbulent flow from occurring in the heated space, which is caused when the gas flowing in the fluid space unnecessarily descends. According to the present invention, the gas flow that runs in substantially horizontal direction in the fluid space is actively created, thereby suppressing a large ascending gas flow, but forming an extremely small ascending gas flow. Consequently, an appropriate line width can be achieved for the pattern.

Further, it is alternatively possible that the heat processing device of the present invention further comprises: a cooling unit formed above the fluid space as a part of the box member, that cools down the gas flowing the fluid space. The cooling unit is a water-cooling jacket including a cooling water flow path, a cooling water supply port and a cooling water discharge hole. Further, the cooling unit is controlled by the control means and may include a water temperature control unit that control the temperature of the cooling water equal to the temperature TF of the fluid space.

The control means has data regarding a temperature at which the volatile substance precipitates and solidifies, and controls the temperature of the cooling unit with reference to the temperature TH of the heat space detected by the third temperature sensor and the temperature data.

Further, the air current producing means may include a gas temperature control unit that control the temperature of the gas supplied to the fluid space from the air supply port, equal to the temperature TF. It is possible that the suction unit has a single suction port opened in an upper center portion of the fluid space, and a plurality of suction ports opened in a circumferential end portion of the fluid space. Alternatively, the suction port and air supply port may be replaced with each other. In the latter case, it is preferable that a heater should be provided close to the suction port to heat the circumferential wall of the suction port, thereby preventing the basic substance from precipitating and attaching to the suction port.

According to another aspect of the present invention, there is provided a heat processing method that bakes a substrate having a resist coating film containing a volatile substance, with use of a heat processing device comprising: a hot plate; a hot plate temperature control unit; a box member having wall surfaces that defines a heat space around the hot plate and defines a fluid space above the heat space, the heat space and the fluid space being communicated to each other and the wall surface that defines the heat space having no opening; and air current producing means including an air supply port and a suction port opened in the wall surfaces that define the fluid space, the method characterized by controlling the hot plate temperature control unit and the air current producing means so that a relationship of TF<TH≦TS≦TP is satisfied where TP represents a temperature of the hot plate, TS represents an upper surface temperature of the substrate W, TH represents a temperature of the heat space and TF represents a temperature of the fluid space.

In the heat processing method of the present invention, the temperature TF of the fluid space can be controlled within a temperature range between 20° C. or higher and 30° C. or lower, and the temperature TS of the upper surface of the substrate can be controlled within a temperature range between 23° C. or higher and 80° C. or lower. It is desirable that the temperature TF of the fluid space should be set equal to room temperature or close to room temperature. Here, in consideration of the influence of the radiant heat from the hot plate, the upper limit value of the temperature TF of the fluid space is set to 30° C., which is slightly higher than a normal room temperature of 23° C. On the other than, a cooling portion is provided in the fluid space in some cases, and therefore in consideration of the cooling effect, the lower limit value of the temperature TF of the fluid space is set to 20° C., which is slightly lower than a normal room temperature of 23° C.

It is preferable that the temperature TS of the upper surface of the substrate should be set equal to room temperature or higher. Especially, in the case of the chemically amplified resist, when the temperature TS is set within a range of 23° C. or higher and 80° C. or lower, the reaction of the acid generator producing $H^+$ ion is promoted, thereby increasing the resolution of the pattern.

The temperature TH of the heat space decreases from the upper surface temperature TS of the substrate gradually towards the upper section of the space, and it gradually becomes close to the temperature TF of the fluid space. That is, the temperature TH of the heat space should necessarily be set higher than the temperature TF of the fluid (TF<TH) at all times, but it suffices if the temperature TH of the heat space is set equal to the upper surface temperature TS of the substrate or higher (TH≦TS). This is because if the temperature TH of the heat space is equal to the temperature TF of the fluid space, the confinement of the heat within the apparatus (the

BRIEF DESCRIPTION OF DRAWINGS

FIG. 11 is a characteristic diagram illustrating a correlation between the temperature of the upper layer portion of the resist and the width of a line of the pattern; and FIG. 12 is a characteristic diagram illustrating a correlation between the temperature of the upper layer portion of the wafer and the uniformity of the width of a line of the pattern within the wafer surface.

BEST MODE FOR CARRYING OUT THE INVENTION

Various preferred embodiments of the present invention will now be described with reference to accompanying drawings.

Figure 2:
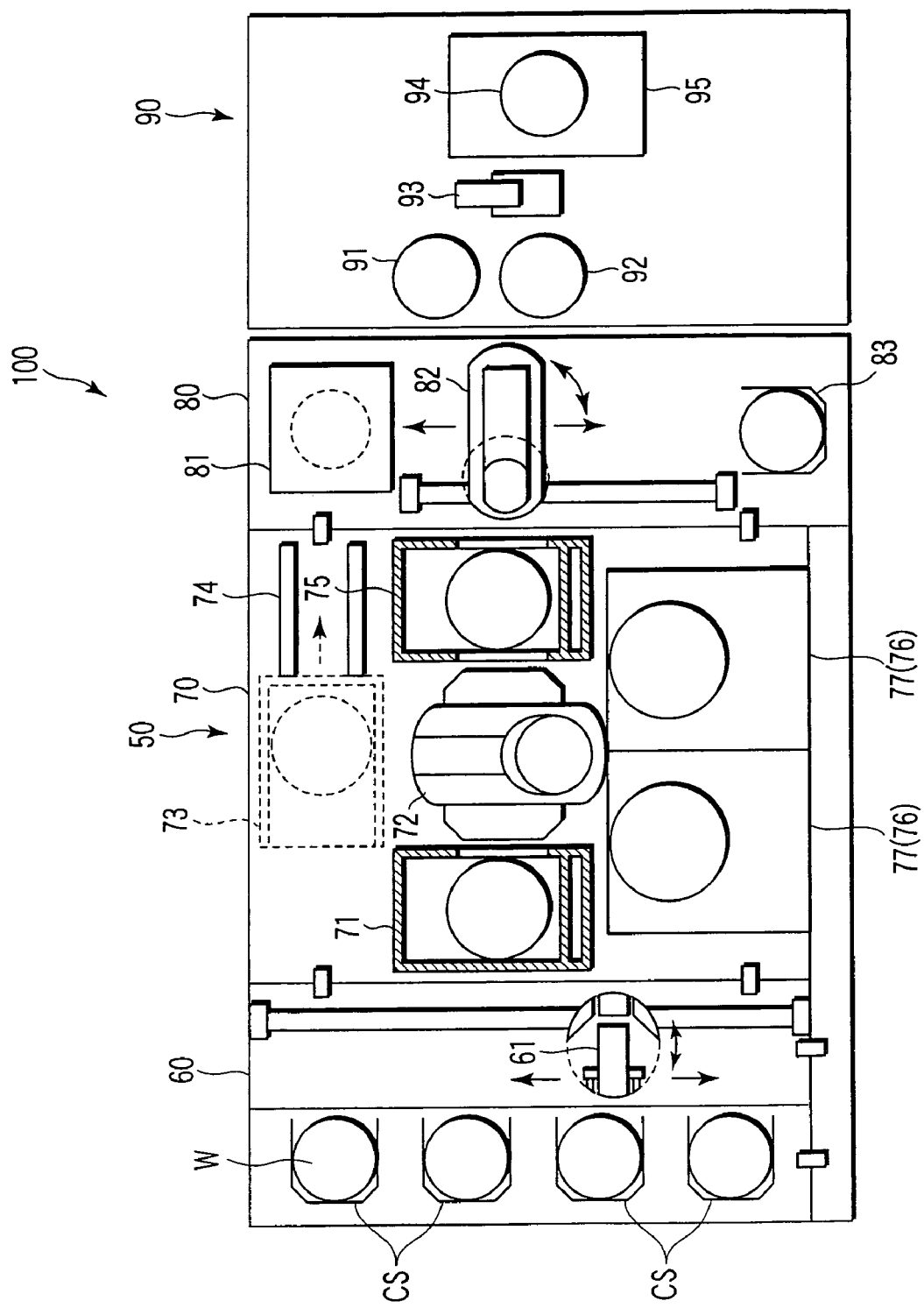
FIG. 2 is a plan view showing a pattern forming system that includes a PEB device, as a heat processing apparatus of the present invention.

First, with reference to FIG. 2, a pattern forming system equipped with a PEB apparatus as the heat processing apparatus of the present invention will now be described. A pattern forming apparatus 100 includes an application and development device 50 and an exposure device 90. The application and development device 50 includes a load in-and-out unit 60, an application and development unit 70, and an interface unit 80. The load in-and-out unit 60 employs a plurality of cassettes CS, which are loaded in or out from the unit, and each of which contains a plurality of silicon wafers W. In the application and development unit 70, a chemically amplified resist is applied on a wafer W before exposure, and a resist coating film is developed after the exposure. The interface unit 80 is provided between the application and development unit 70 and exposure device 90, and the unit 80 is equipped with a transfer mechanism that transfers wafers W to each other between the unit 70 and device 90. The exposure device 90 includes an ArF excimer laser light source used to expose a resist coating film into a pattern. Further, the loading in-and-out unit 60 is equipped with a sub-arm mechanism 61 that transfers wafers W to each other between a cassette CS and the application and development unit 70.

Further, the application and development unit 70 includes an application section 76, a development section 77 and two or three processing units 71, 73 and 75. Although it is not illustrated in the figure, on each of the processing units 71, 73 and 75, a pre-baking device, a PEB device, a post-baking device, an adhesion device and a cooling device are stacked in a multi-stage fashion. It should be noted that the processing unit 73, which is illustrated in dotted lines, is formed detachable and further movable along a guide rail 74 when it is mounted.

The application and development unit 70 includes a main arm mechanism 72 that conveys wafers W between the unit 70 and each of the load in-and-out unit 60, application section 76, development section 77, processing units 71, 73 and 75, and an interface unit 80. The main arm mechanism 72 is supported by an XWZ θ-drive mechanism, which is not shown in the figure, to be movable in the X-, Y- and Z-directions and rotatable around the Z axis.

The interface unit 80 includes a periphery exposure device 81 that exposes only the peripheral portion of a wafer W returned from the exposure device 90, a placement section 83 for wafers W, and a sub-arm mechanism 83 that transfers a wafer W to each other between the placement section 83, the periphery exposure device 81 and the exposure device 90. It should be noted that the placement section 83 of the interface unit 80 is formed by, for example, stacking two stages of holder shelves for buffer one on another.

The exposure device 90 includes a pre-process stage 91 on which wafers W before exposure are placed, a vacuum chamber 95 in which exposure is carried out, an exposure light source 94 and a post-process stage 92 on which wafers W after the exposure are placed, and a conveying arm 93 that transfers a wafer W to each other between the stages 91 and 92 and the vacuum chamber 95.

The pattern forming apparatus 100 having the above-described structure carries out the processing of wafers W in the following manner.

First, a wafer cassette CS in which wafers W are contained is loaded from outside to the load in-and-out unit 60, where a wafer W is taken out from the wafer cassette CS by the sub-arm mechanism 61. The wafer W is passed by the main arm mechanism 72 to the processing unit 71, where the adhesion process is carried out.

Next, the wafer W is transferred to the application section 76, where a chemically amplified-type resist liquid is spin-coated to form a resist film of a predetermined thickness is formed. After that, the wafer W is subjected to the pre-baking process in the pre-baking device in the processing unit 71, and then it is sent to the interface section 80 via the main arm mechanism 72 and the sub-arm mechanism 82.

The wafer W is temporarily contained in the placement section 83 in the interface unit 80, where the temperature of the wafer W is adjusted to the same temperature of the atmosphere in the exposure device 90, and then the water W is transferred to the exposure device 90. After the exposure, the wafer W is sent back to the interface unit 80, where only the peripheral portion of the wafer W is exposed by the periphery exposure device 81. Then, in the case where there is no room for the wafer W in the development section 77, it is temporarily contained in the placement section 83 within the interface unit 80.

Subsequently, the wafer W is sent via a transfer unit, which is not shown in the figure, to the PEB device in the processing unit 75, where it is subjected to the post-exposure baking process. Then, the wafer is cooled by the cooling device in the processing unit 75. After it is cooled down, the water is subjected to the development process in the development section 77, and thus a resist mask is formed.

After that, the wafer W is transferred to the post-baking device in the processing unit 71 or 75, where it is subjected to the post-baking process. After the process, the wafer W is cooled down by the cooling device in the processing unit 71 or 75. Then, the wafer is sent back into the cassette CS on the load in-and-out unit 60 via a transfer unit, which is not shown in the figure, and thus a series of predetermined application and development processes are finished.

First Embodiment

Next, the first embodiment of the present invention will now be described with reference to FIGS. 3 to 7.

The entire structure of a PEB device 1 is a single system that is controlled by a controller 22. Four temperature sensors 26, 27, 28, and 29 and one built-in thermometer (not shown) are connected to input sections of the controller 22, and thus each of the sensors inputs a detected temperature signal to the unit. The first temperature sensor 26 is mounted on a hot plate 2, and thus a temperature TP of the hot plate 2 is detected. For the first temperature sensor 26, a contact-type thermocouple or a platinum resistance thermometer, for example, is used. The second temperature sensor is provided above a wafer W placed on the hot plate 2, and thus an upper surface temperature TS of the wafer W is detected. For the second temperature sensor 27, a non-contact-type optical temperature sensor (heat sensitive sensor), for example, is used. The third temperature sensor 28 is provided in a heat space 30, and thus a temperature TH of the heat space is detected. For the third temperature sensor 28, a contact-type thermocouple or a platinum resistance thermometer or a non-contact-type optical temperature sensor (heat sensitive sensor) may be used. The fourth temperature sensor 29 is provided in a fluid space 31, and thus a temperature TF of the fluid space is detected. For the fourth temperature sensor 29, a contact-type thermocouple, a platinum resistance thermometer or a non-contact-type optical temperature sensor (heat sensitive sensor) may be used. The fifth built-in temperature meter 7a is provided inside a filter adjustment mechanism 7, and thus the temperature of a filter 6 is detected. For the fifth built-in temperature sensor 28, a contact-type thermocouple or a platinum resistance thermometer, for example, is used.

To output sections of the controller 22, a hot plate temperature control unit 3, a filter control mechanism 7, a suction unit 10, a cooling water supply source 15, a cooling water temperature control unit 16, a water conveyance unit 17, an air supply unit 18, an air temperature control unit 19 and an air supply source 20 are connected, respectively. With this structure, a control signal is output to each of these members.

A memory section of the controller 22 stores such data as the temperature TP of the hot plate 2, the upper surface temperature TS of the substrate W, the temperature TH of the heat space 30, the temperature TF of the fluid space 31, a temperature at which a basic substance (quencher; acid inhibitor) precipitates under atmospheric pressure and the temperature of the filter 6. These data are obtained in advance by empirical testing for each recipe of the PEB process. It should be noted that the memory section of the controller 22 stores not only the temperature data mentioned above, but also other data corresponding to the recipes of the PEB process (for example, data of correlations between the temperature TF of the fluid space and the temperature of the air and between the temperature TF and the air flow).

Figure 3:
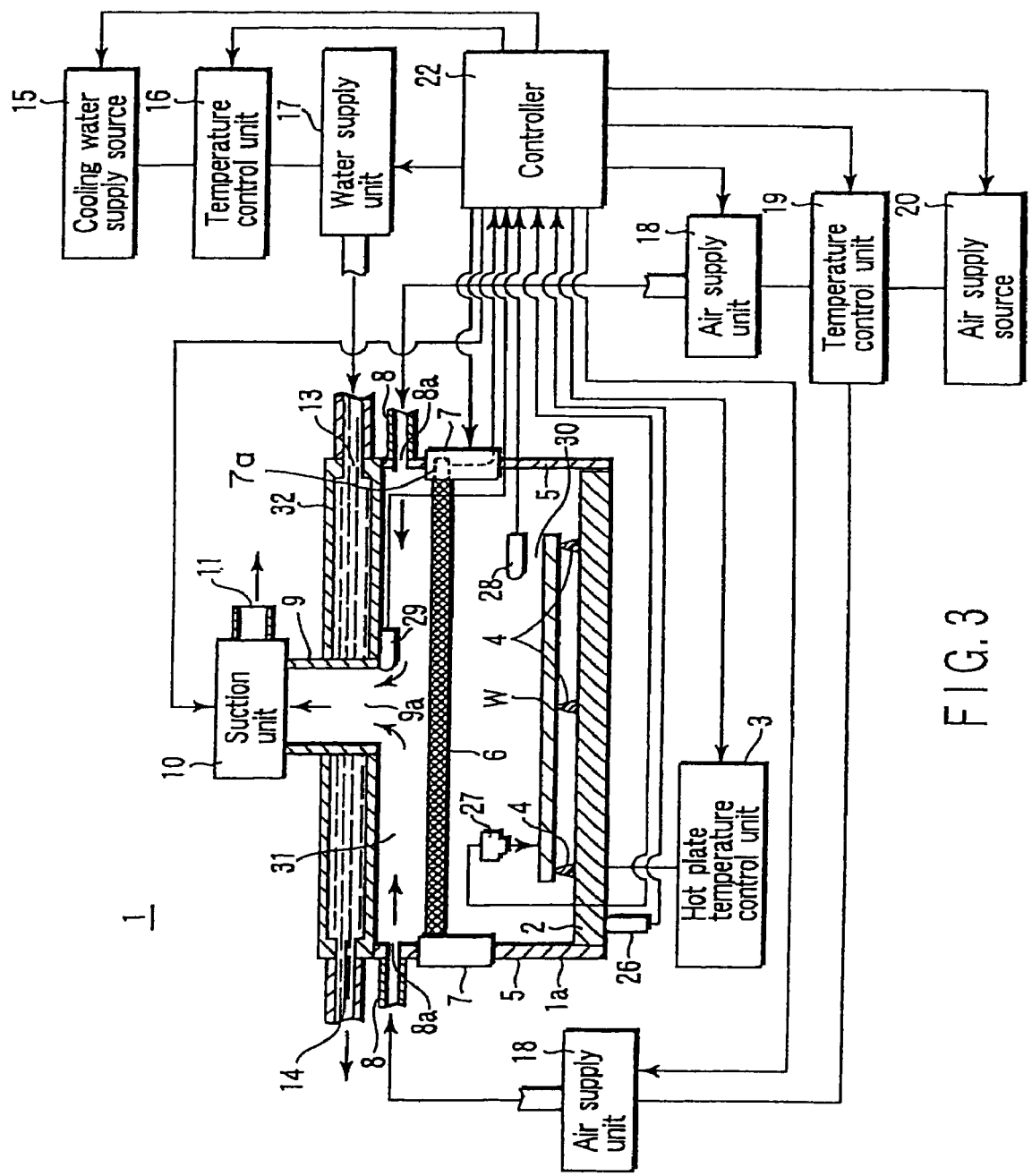
FIG. 3 is a block cross sectional diagram schematically showing a heat processing apparatus according to the first embodiment of the present invention.
Figure 5:
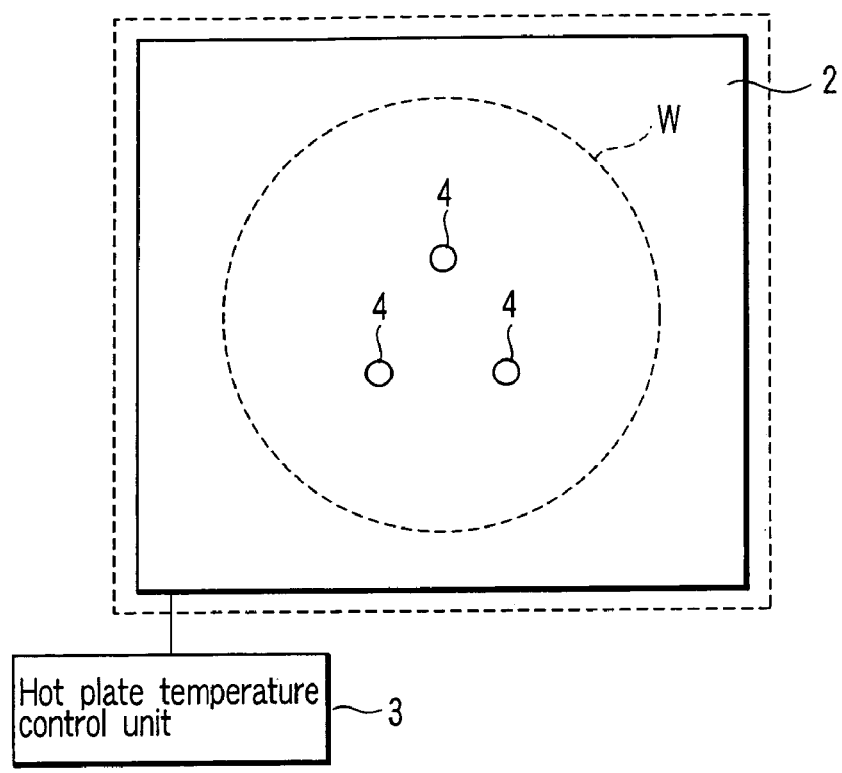
FIG. 5 is a plan view showing a hot plate.
Figure 6:
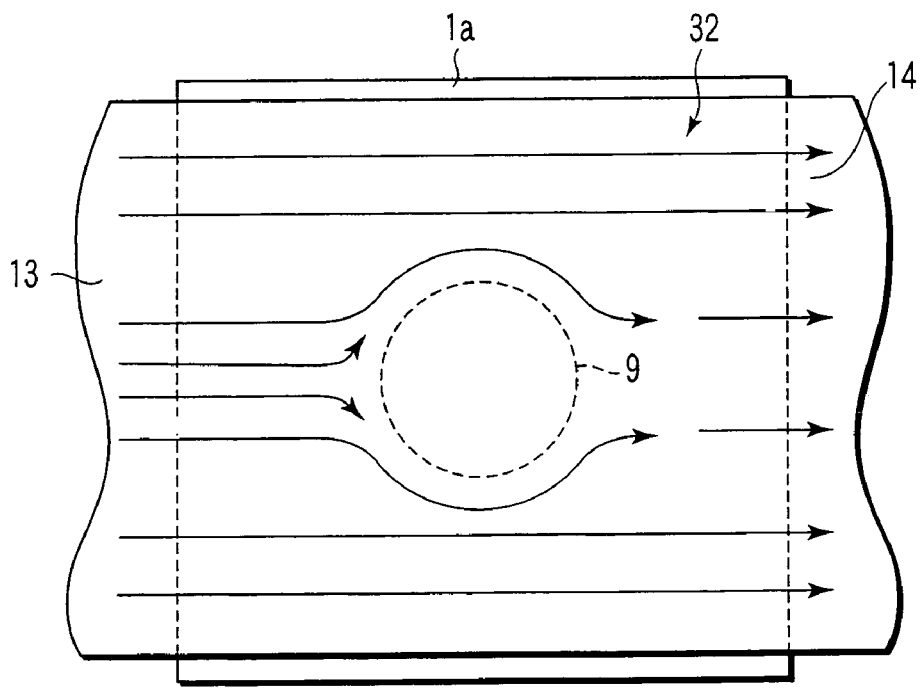
FIG. 6 is a plan view schematically showing an air flow around a cooling section in the heat processing apparatus.

As shown in FIG. 6, the PEB device 1 includes a box 1a having a substantially rectangular parallelepiped shape. The box 1a is formed of a support plate (not shown) of the hot plate 2, lateral circumferential walls and a cooling unit (water cooling jacket) 32, and thus the heat space 30 and the fluid space 31 are defined. The interior of the PEB device 1 is roughly divided into three areas, namely, the heat space 30, the fluid space 31 and the cooling unit 32, as illustrated in FIG. 3. The heat space 30 is located below the PEB device 1. As can be seen in FIGS. 3 and 5, the heat space 30 is provided with the hot plate 2, which is designed to heat silicon wafers W. There are a plurality of (for example, 4) support pins provided on the hot plate 2, and with these support pins 4, a water W is supported without touching the heat plate 2. As described, the wafer W is placed to be in non-contact with the hot plate 2, and therefore heat is applied substantially evenly onto the upper and bottom surfaces of the wafer, and further the attachment of dust or the like to the bottom surface of the wafer W can be prevented.

Figure 9:
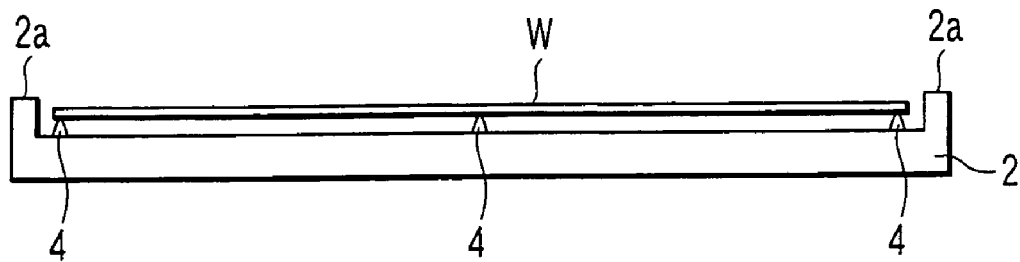
FIG. 9 is a lateral cross sectional view showing an alternate version of the hot plate.

It should be noted here that as shown in FIG. 9, it is alternatively possible that a projecting portion 2a is formed on an outer circumference of the hot plate 2 so that a wafer W can be housed in a recess portion formed by the projecting portion 2a. With the hot plate 2 formed as just described, it is possible to suppress the outer air from flowing around to the bottom surface side of the wafer W, and thus the uniformity degree of temperature within the wafer surface can be improved.

The heat plate temperature control unit 3 is connected to the hot plate 2. The heat plate temperature control unit 3 has a built-in power source, and this power source circuit is connected to the output sections of the controller 22. The CPU of the controller 22 reads the temperature TP of the hot plate from the memory section and compares the data signal of the hot plate temperature TP with a temperature detection signal input from the temperature sensor 26. Then, the CPU sends a control signal to the heat plate temperature control section 3 so as to make the difference between the data signal and the detection signal to be zero. In this manner, the temperature of the hot plate 2 is adjusted to be equal to the hot plate temperature TP.

The fluid space 31 is located at a level of a medium to an upper section of the PEB device 1, and communicates with the heat space 30. In the fluid space 31, a cool air flow flowing in a substantially horizontal direction is created and thus the heat air of the heat space 30 is cleaned (purged). The cool air flow also has a function of controlling the ascending air flow in the heat space 30. More specifically, a plurality of air supply pipes 5 communicating to the air supply unit 18 are formed through the lateral peripheral wall 5, and air blow ports 8a of these pipes are opened in the fluid space 31. Further, a suction pipe 9 communicating with the suction unit 10 is put through a part of the water-cooling jacket 32, and a suction port 9a thereof is opened in the fluid space 31. In the device 1 of this embodiment, the four air blow ports 8a are formed respectively at four corner sections of the lateral circumferential wall 5 and the single suction port 9a is formed at a center of the water-cooling jacket 32 located at an upper section. It should be noted that the number of the air blow openings 8a is not limited to 4, and may be 2, 3, 5, 6, 7, or 8.

With regard to air supplied from each of the air blow ports 8a, the temperature, flow amount and purity thereof are adjusted by the air supply source 20. Thus, the air is supplied via the air temperature control unit 19 and the air supply unit 18 to the fluid space 31 through the supply pipe 8. When clean air is supplied from the air blow ports 8a into the fluid space 31, the air flows substantially horizontally in the fluid space 31 and then the air is suctioned to the suction unit 10 via the suction port 9a, to be discharged to the outside from an exhaustion port 11.

The cooling unit 32 is located at an upper section of the PEB device 1. The cooling unit 32 is made of a cooling jacket including a water supply port 13 and a water discharge port 14, and is designed to cool the air by means of heat exchange with the air flowing in the fluid space 31. The water supply port 13 is communicated to a discharge side of the built-in pump of the water conveyance unit 17, and the temperature control unit 16 is communicated to a suction side of the built-in pump of the water conveyance unit 17. The temperature control unit 16 is communicated to the cooling water supply source 15. On the other hand, the water discharge hole 14 is communicated to a discharge water tank which is not shown in the figure. As it is, the air in the fluid space 31 increases in temperature when absorbing radiant heat from the hot plate 2. In order to avoid this, the coolant unit 32 is used to cool down the temperature of the air. In this manner, the temperature of the heat space 30 is decreased gradually from the upper surface temperature of the substrate W towards the top and eventually becomes close to the temperature of the fluid space. It should be noted that the suction pipe 9 is put through the central portion of the cooling jacket 32, but as shown in FIG. 6, the cooling water flowing in the cooling jacket 32 is designed to detour the suction pipe when it flows.

Figure 7:
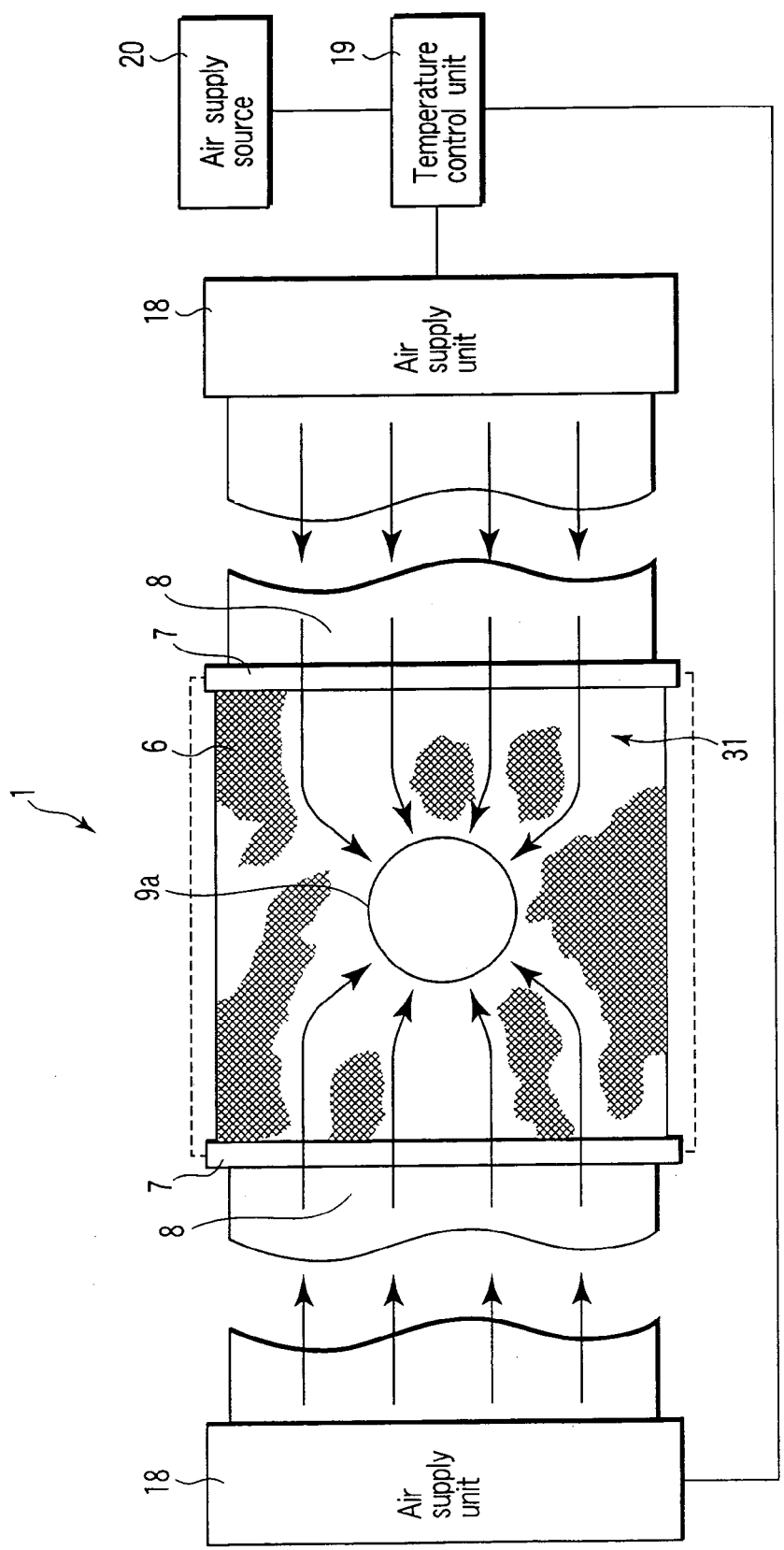
FIG. 7 is a plan view showing a fluid space in the heat processing apparatus.

In an upper section of the heat space 30 and approximately at an interface between the heat space 30 and fluid space 31, an aluminum-made filter 6 having, for example, a two-layered mesh structure is mounted to be in contact with the inner wall surface of a wall member 5. The filter 6 is formed to have a rectangular shape to match an internal plane shape of the PEB device 1, as shown in FIG. 7.

The filter 6 is designed to trap basic substances (quencher) generated from the resist coat film when it is heated by the hot plate 2. Due to the heat of the hot plate 2, gasified matter generated from the wafer W are suctioned out from the suction port 9a by the air flow in the fluid space 31. However, still, there is a possibility that some of the matter precipitated in the form of solid matter due to the cooling effect of the coolant unit 32 and such solid matter fall on and attach to the surface of the wafer W. In order to avoid this, the basic substance (quencher) attached to the filter 6 is inhibited from falling onto the wafer W.

Further, air is supplied to the fluid space 31, and therefore the air flowing in the fluid space 31 may descend, to disturb the flow within the heat space (which is a slight ascending air flow created by the temperature difference). In order to avoid this, the filter 6 further has a function of the so-called rectifying effect as well, to prevent the gas flowing in the fluid space from descending.

The filter adjustment mechanism 7 is provided for each end of the filter 6. Each filter adjustment mechanism 7 includes an ascending/descending mechanism (not shown) that ascends or descends the filter 6. Further, the filter adjustment mechanism 7 includes a built-in thermometer 7a serving as filter temperature monitoring means. The built-in thermometer 7a serves to detect the temperature of the filter 6 and send the detected temperature signal to the controller 22. The controller 22 monitors the change in temperature of the filter 6 on the basis of the signals of the detected temperatures of the filter, which are inputted to the unit, and controls the ascending/descending operation of the filter adjustment mechanism 7 in accordance with the change in the temperature. Thus, the height of the filter 6 is adjusted (the distance between the wafer W and the filter 6 is adjusted.)

For example, if a different processing recipe is employed in which the temperature at which a basic substance from a wafer W is solidified varies, the precipitation temperature (or condensation temperature) of the basic substance in that processing recipe is assigned in advance to the filter adjustment mechanism 7. Then, the detected filter temperature and the basic substance (solidified matter) generating temperature are compared with each other. Based on the comparison, the height of the filter is automatically adjusted, thereby making it possible to automatically trap the basic substance (solidified matter).

The filter 6 is detachably mounted to the box 1a, and therefore it can be replaced periodically. Further, the used filter 6 can be removed and subjected to a cleaning process, with which the filter can be used again, thereby achieving easy maintenance. It should be noted that the filter 6 may be contained in a cartridge case, to achieve such a structure that the cartridge case can be removed from the box 1a together with the filter 6.

The state of the internal temperature during the process of the PEB device 1 having the above-described structure will now be described. It should be noted that the following descriptions are made in connection with an example where the supplied gas is air; however, it is alternatively possible to use nitrogen gas in place of air.

In advance, the temperature inside the PEB device 1 is adjusted. That is, first, the temperature of the hot plate 2 is set to, for example, 140° C., by the hot plate temperature control unit 3. Thus, it is heated to 140° C., and after that, the temperature is maintained at 140° C.

Subsequently, air having a humidity of, for example, 45% is generated by the air supply source 20, and then the temperature of the air is conditioned to, for example, 23° C., by the temperature control unit 19. Thus conditioned air is supplied by the air supply unit 18 into the PEB device 1 from each air blow port 8a at a flow rate of, for example, 10 L/min.

Further, as the suction unit 10 is driven, an air flow that is directed from the air blow port 8a towards the suction port 9a is created in the fluid space 31. At the same time, a slight ascending air flow is created in the heat space 30 and the air is suctioned from the suction port 9a to be exhausted from the exhaustion port 11.

It should be noted that a slight amount of air supplied from the air blow port 8a flows into the heat space 30, and a slight descending air flow is formed; however, this air flow does not significantly disturb the ascending air flow described before. With the above-described structure, the gas in the heat space 30 is continuously cleaned (purged).

On the other hand, a cooling water is generated by the cooling water supplying source 15, and the temperature of the cooling water is adjusted to, for example, 23° C. by the temperature control unit, and the cooling water is supplied by the water conveyance unit 17 into the cooling unit 32 from the cooling water supply port 13 at a flow rate of, for example, 1 L/min.

The cooling water supplied from the cooling water supply port 13 is discharged from the cooling water discharge port 14 to the outside, thereby forming a water flow in the cooling unit 32. In this manner, the fluid space 31 located down below can be maintained at a constant temperature (for example, 23° C.).

As described above, the heat plate 2 is heated at a constant temperature (for example, 140° C.) at all times, and therefore the heat is confined in the heat space 30. Thus, as it is, the temperature is further increased. In order to avoid this, air is supplied into the fluid space 31 and cooling is performed by the cooling unit 32, and thus the heat is radiated from the heat space 30, thereby suppressing the confinement of the heat. Consequently, the periphery of the wafer W replacement section located underneath the heat space 30 is maintained at a temperature appropriate for the process. More specifically, the upper surface temperature of the wafer W is controlled to, for example, 80° C. or less.

To summarize, the controller 22 reads from the memory the temperature TP of the hot plate 2, the upper surface temperature TS of the substrate W, the temperature TH of the heat space 30, and the temperature TF of the fluid space 31, and then controls the hot plate temperature control unit 3, the suction unit 10, the cooling water temperature control unit 16, the water conveyance unit 17, the air supply unit 18, and the air temperature control unit 19 so that a relationship of TF<TH≦TS≦TP is satisfied.

In particular, when the temperature of the air flow by the air flow forming means is made equal to the temperature of the cooling water by the water flow forming means, the heat space 30 (fluid space 31) can be cooled down more effectively.

Second Embodiment

Next, the second embodiment of the present invention will now be described with reference to FIG. 8. It should be noted that the parts of the second embodiment overlapping with those of the first embodiment will not be repeated in the following descriptions.

In a PEB device 1A of the second embodiment, a porous rectifying plate 40 is mounted in a box 1a, and air is allowed to flow into a fluid space from the air blow port 8a through pores 40a of the rectifying plate. A plurality of suction ports 9a are opened in a lateral circumferential wall of the box 1a and a heater 42 is provided in the vicinity of each of the suction ports 9a. The air blow port 8a is opened at a center of the upper section of the box 1a, that is, at a center of the cooling unit 32, and the air blow port is communicated to the air temperature control unit 19a and the air supply source 20A. The suction ports 9a are opened respectively at the four corner sections of the lateral circumferential wall, and they are communicated to a pump suction hole of the suction unit 10A.

The PEB device 1A has such a systematic structure such that the entirety thereof is controlled by a controller 22A. Four temperature sensors 26, 27, 28 and 29A are connected respectively to input sections of the controller 22A, and a detected temperature signal is input from each respective sensor to the controller 22A. The first to third temperature sensors 26, 27 and 28 are the same as those used in the first embodiment. The fourth temperature sensor 29A is mounted on the rectifying plate 40 and it is designed to detect a temperature TF of the fluid space 31. For the fourth temperature sensor 29A, a contact-type thermocouple, a platinum resistance thermometer or a non-contact-type optical temperature sensor (heat sensitive sensor), for example, is used.

To output sections of the controller 22A, a hot plate temperature control unit 3, a suction unit 10, a cooling water supply source 15, a cooling water temperature control unit 16, a water conveyance unit 17, an air supply unit 18A, an air temperature control unit 19A, an air supply source 20A and a heater power supply 44 are connected. With this structure, a control signal is output to each of these members.

Air is supplied from the air blow port 8a to the fluid space 31 at a flow rate of 1 to 3 liters/min, and at the same time, air is exhausted from the fluid space 31 via the suction port 9a to substantially the same degree. Here, the controller 22A controls the amount of electricity supplied to the heater power supply 44 to heat the circumferential wall of the suction port 9a to a temperature of, for example, 60° C. or higher. In this manner, the precipitation and attachment of basic substances onto the circumferential wall of the suction port 9a can be prevented. Further, the controller 22A reads from the memory the temperature TP of the hot plate 2, the upper surface temperature TS of the substrate W, the temperature TH of the heat space 30 and the temperature TF of the fluid space 31, and then controls the hot plate temperature control unit 3, the suction unit 10A, the cooling water temperature control unit 16, the water conveyance unit 17, the air supply unit 18A, and the air temperature control unit 19A so that a relationship of TF<TH≦TS≦TP is satisfied.

EXAMPLE

Next, the PEB device 1 (Example 1) shown in FIG. 3 and a conventional PEB device (Comparative Example 1) that includes only a hot plate, but does not include air supply means or cooling water supply means, were tested to measure the temperature of the resist upper layer section applied to a wafer in each device. The measurements were made at 5 points in the wafer.

The conditions for the measurement were as follows. The temperature of the hot plate 2 in each device was set to 140° C., and in the Example, air having a humidity of 45% and a temperature of 23° C. was supplied at a rate of 2 liters per minute. Further, cooling water having a temperature of 23° C. was supplied into the coolant unit at a rate of 1 liter per minute.

Figure 10:
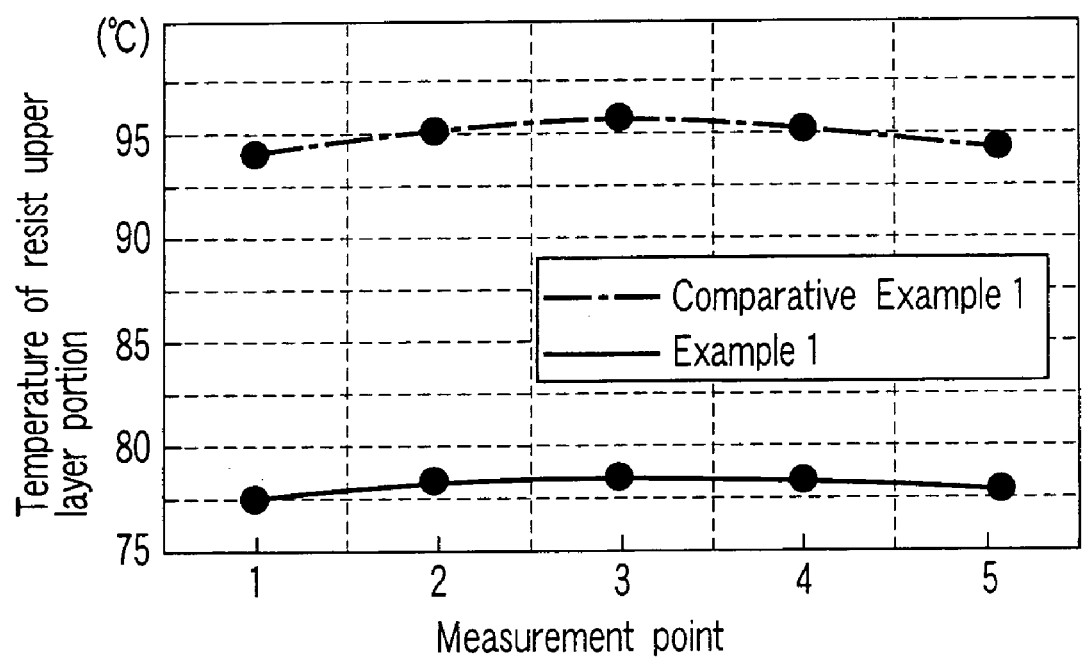
FIG. 10 is a diagram showing a temperature distribution summarized from results of the measurement of the temperature in the upper layer section (the upper layer section of the wafer) of the resist film.

The results of the measurements are illustrated in FIG. 10. As is clear from the results of the measurements, the temperatures of all the measurement points were 80° C. or less in Example 1. By contrast, the temperatures were about 95° C. in Comparative Example 1.

Next, how the temperature of the upper layer section of a wafer influences the width of a pattern line, and the uniformity of the line width were tested.

Figure 1:
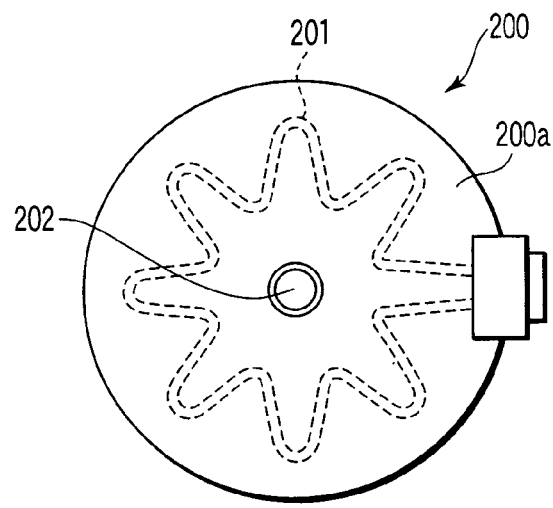
FIG. 1 is a plan view showing a cover on a top portion of a conventional apparatus.
Figure 4:
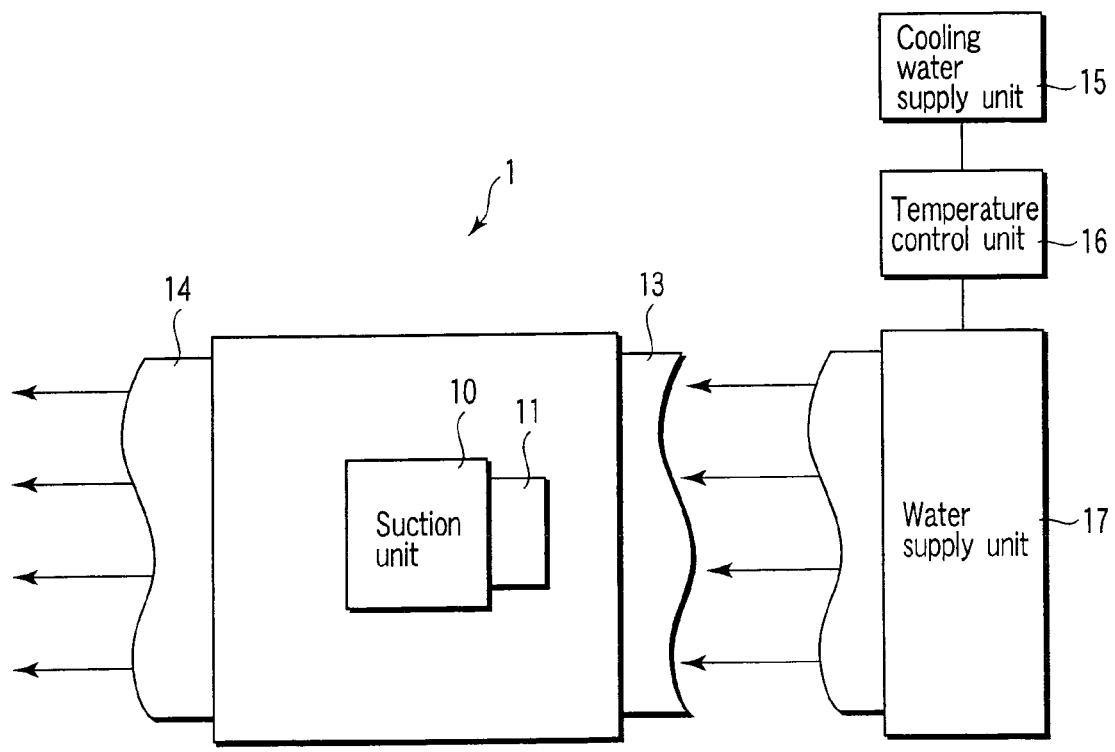
FIG. 4 is a plan view showing the heat processing apparatus according to the first embodiment.
Figure 8:
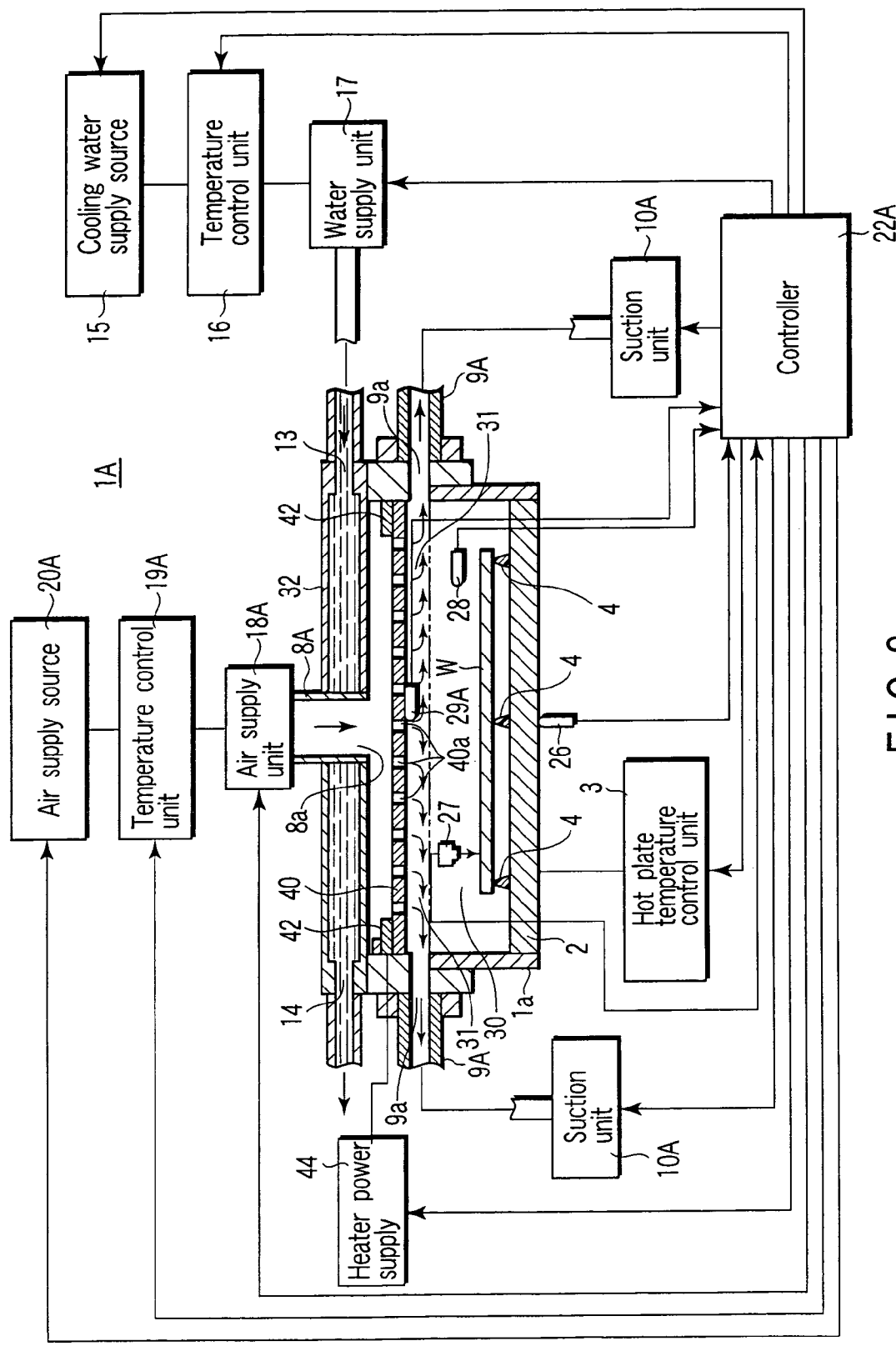
FIG. 8 is a block cross sectional diagram schematically showing a heat processing apparatus according to the second embodiment of the present invention.

In this test, the PEB device 1 of the present invention shown in FIG. 8 (Example 2 or 3) and a conventional PEB device (Comparative Example 2 or 3) that includes a hot plate and a heat pipe shown in FIG. 1, were tested to measure the temperature of the resist upper layer section applied to a wafer in each device. The conditions for the measurement were as follows. The temperature of the hot plate 2 in each device was set to 130° C. Further, for the purpose of purely investigating the temperature influence in the upper layer section of the wafer, air purge of the inside of the device was not carried out in each case.

In the Examples, the temperature of the wafer upper layer section was measured in the case where cooling water having a temperature of 23° C. was supplied into the coolant unit at a rate of 1 liter per minute (Example 2) and in the case where cooling water having a temperature of 40° C. was supplied into the coolant unit at a rate of 1 liter per minute (Example 3). On the other hand, in the Comparative Examples, the temperature of the wafer upper layer section was measured in the case where the temperature of the cover section in which the heat pipe was formed was 100° (Comparative Example 2) and in the case where the temperature of the cover section was 125° C. (Comparative Example 3).

The results are illustrated in FIGS. 11 and 12.

As is clear from the graph of FIG. 11, as the temperature of the upper layer portion of the wafer becomes lower due to cooling, the line width of the pattern becomes narrower. In general, the line width of a pattern becomes narrower as the exposure amount becomes larger, and it becomes wider as the exposure amount becomes less.

Based on this fact, when the temperature of the upper layer portion of the wafer is adjusted by cooling, the line width of the pattern can be made narrow as needed for a less amount of exposure. Consequently, the exposure time can be shortened, which is another advantage. That is, the entire processing time can be shortened, and therefore the productivity can be improved.

Further, it can be understood from the graph of FIG. 12 that as the temperature of the upper layer portion of the wafer becomes lower due to cooling, the variation in line width of the pattern in the wafer surface becomes less, thus improving the uniformity. That is, when the temperature of the upper layer portion of the wafer is controlled by cooling, the occurrence of error in the application and development process can be suppressed, thereby making it possible to improve the yield.

From the results of the tests described above, the inventors of the present invention have been able to confirm the effectiveness of the heat processing device of the present invention and the method of controlling the temperature in a heat processing device. It has been confirmed in particular that when the temperature of the upper layer portion of the wafer is 80° C. or less, the line width and the uniformity in line width can be drastically improved as compared to when the temperature is 95° C. or higher.

It should be noted that in the above-described embodiment, the heat processing device of the present invention is applied to a PEB device of a coating and development processing device. The use of the present application is not limited to this, but it can be applied to other heat processing devices, such as a pre-baking device or post baking device.

As is clear from the above-provided descriptions, it is possible to provide a heat processing device and a heat processing method that can improve the accuracy of the development process of a pattern formed on a wafer to be processed to carry out a stable pattern development process by carrying out the temperature control in the heat processing device.

The invention claimed is:

1. A heat processing device that bakes a substrate having a resist coating film containing a volatile substance, the device comprising:
   a hot plate that heats the substrate;
   a hot plate temperature control unit that controls a temperature of the hot plate;
   control means for controlling the hot plate temperature control unit;
   a box member having wall surfaces that defines a heat space around the hot plate and defines a fluid space above the heat space, the heat space and the fluid space being communicated to each other and the wall surface that defines the heat space having no opening;
   air current producing means including an air supply port and a suction port opened in the wall surfaces that define the fluid space, that supplies a gas from the air supply port to the fluid space and exhausts the supplied gas from the fluid space via the suction port by suction, to create a current of air flowing in a substantially horizontal direction in the fluid space;
   a filter provided in the box member to partition the heat space and the fluid space from each other, that traps the volatile substance; and
   means for detecting a temperature of the filter, wherein the control means adjusts the distance between the filter and the substrate with reference to the detected temperature of the filter or a change in temperature of the filter.

2. The heat processing device according to claim 1, wherein the control means and the air current producing means ensure that a relationship of $TF<TH \leq TS \leq TP$ is satisfied where TP represents a temperature of the hot plate, TS represents an upper surface temperature of the substrate W, TH represents a temperature of the heat space and TF represents a temperature of the fluid space.

3. The heat processing device according to claim 2, further comprising:
   a first temperature sensor that detects the temperature TP of the hot plate, a second temperature sensor that detects the upper surface temperature TS of the substrate, a third temperature sensor that detects the temperature TH of the heat space and a fourth temperature sensor that detects the temperature TF of the fluid space.

4. The heat processing device according to claim 1, further comprising:
   filter ascending/descending means controlled by the control means, for changing a distance between the filter and the substrate.

5. The heat processing device according to claim 3, further comprising:
   a cooling unit formed above the fluid space as a part of the box member, that cools down the gas flowing the fluid space.

6. The heat processing device according to claim 5, wherein the cooling unit is a water-cooling jacket including a cooling water flow path, a cooling water supply port and a cooling water discharge port.

7. The heat processing device according to claim 5, wherein the cooling unit is controlled by the control means and includes a water temperature control unit that controls the temperature of the cooling water equal to the temperature TF of the fluid space.

8. The heat processing device according to claim 5, wherein the control means has data regarding a temperature at which the volatile substance precipitates and solidifies, and controls the temperature of the cooling unit with reference to the temperature TH of the heat space detected by the third temperature sensor and the temperature data.

9. The heat processing device according to claim 8, wherein the air current producing means includes a gas temperature control unit that controls the temperature of the gas supplied to the fluid space from the air supply port to be equal to the temperature TF.

10. The heat processing device according to claim 8, wherein the suction unit has a single suction port opened in an upper center portion of the fluid space.

11. The heat processing device according to claim 8, wherein the suction unit has a plurality of suction ports opened in a circumferential end portion of the fluid space.

12. The heat processing device according to claim 11, further comprising:
    a heater provided near each of the suctions ports.

13. The heat processing device according to claim 1, wherein the control means controls the air current producing means to make the temperature TF of the fluid space fall within a temperature range between 20° C. or higher and 30° C. or lower, and controls the hot plate temperature control unit to make the temperature TS of the upper surface of the substrate fall within a temperature range between 23° C. or higher and 80° C. or lower.

14. A heat processing method that bakes a substrate having a resist coating film containing a volatile substance, with use of a heat processing device characterized by comprising:
    a hot plate; a hot plate temperature control unit;
    a box member having wall surfaces that defines a heat space around the hot plate and defines a fluid space above the heat space, the heat space and the fluid space being communicated to each other and the wall surface that defines the heat space having no opening;

air current producing means including an air supply port and a suction port opened in the wall surfaces that define the fluid space, controlling the hot plate temperature control unit and the air current producing means so that a relationship of TF<TH.ltoreq.TS.ltoreq.TP is satisfied where TP represents a temperature of the hot plate, TS represents an upper surface temperature of the substrate W, TH represents a temperature of the heat space and TF represents a temperature of the fluid space;

a filter provided in the box member to partition the heat space and the fluid space from each other, that traps the volatile substance; and means for detecting a temperature of the filter, wherein controlling the hot plate temperature control unit includes adjusting the distance between the filter and the substrate with reference to the detected temperature of the filter or a change in temperature of the filter.

15. The heat processing method according to claim 14, further comprising:

controlling the air current producing means to make the temperature TF of the fluid space fall within a temperature range between 20° C. or higher and 30° C. or lower, and controlling the hot plate temperature control unit to make the temperature TS of the upper surface of the substrate fall within a temperature range between 23° C. or higher and 80° C. or lower.

* * * * *